United States Patent
Miyagawa et al.

(10) Patent No.: US 6,261,501 B1
(45) Date of Patent: Jul. 17, 2001

(54) RESIN SEALING METHOD FOR A SEMICONDUCTOR DEVICE

(75) Inventors: Tsutomu Miyagawa; Kunihiro Aoki; Masahiro Kodama; Fumio Miyajima, all of Nagano (JP)

(73) Assignee: Apic Yamada Corporation, Nagaano (JP)

(*) Notice: Subject to any disclaimer, the term of this patent is extended or adjusted under 35 U.S.C. 154(b) by 0 days.

(21) Appl. No.: 09/235,403

(22) Filed: Jan. 22, 1999

(30) Foreign Application Priority Data

Jan. 23, 1998 (JP) .................................. 10-011382
Dec. 4, 1998 (JP) .................................. 10-345318

(51) Int. Cl.$^7$ ............................. B29C 45/02; B29C 70/74
(52) U.S. Cl. ............................. 264/272.15; 264/272.17; 264/276
(58) Field of Search .................................. 264/261, 263, 264/267, 272.11, 272.15, 272.17, 276; 29/827, 840, 841; 438/106, 125–127; 257/787, 788; 425/116, 544

(56) References Cited

U.S. PATENT DOCUMENTS

| | | | |
|---|---|---|---|
| 4,143,456 | * 3/1979 | Inoue | 29/588 |
| 5,203,076 | * 4/1993 | Banerji et al. | 29/840 |
| 5,218,234 | * 6/1993 | Thompson et al. | 257/787 |
| 5,249,101 | * 9/1993 | Frey et al. | 264/272.17 |
| 5,674,343 | * 10/1997 | Hotta et al. | 264/272.17 |
| 5,824,252 | * 10/1998 | Miyajima | 264/272.17 |
| 5,891,377 | * 4/1999 | Libres et al. | 264/272.14 |
| 5,891,384 | * 4/1999 | Miyajima | 264/511 |
| 5,955,115 | * 9/1999 | Bolanos et al. | 425/116 |
| 6,000,294 | * 12/1999 | Wang et al. | 425/125 |
| 6,048,483 | * 4/2000 | Miyajima | 425/544 |
| 6,080,354 | * 6/2000 | Miyajima | 264/511 |
| 6,081,997 | * 7/2000 | Chia et al. | 29/841 |

* cited by examiner

Primary Examiner—Angela Ortiz
(74) Attorney, Agent, or Firm—Sughrue, Mion, Zinn, Macpeak & Seas, PLLC

(57) ABSTRACT

A resin sealing method for sealing a joining portion between a semiconductor chip 12 and a substrate 10 by filling a underfilled portion of a molded piece 40 in which a semiconductor chip is mounted on a substrate with solder bumps studded therebetween with sealing resin 14 by a transfer molding process, the method being characterized in that when the molded piece 40 is clamped with a mold of a transfer molding machine, the perimeter of the underfilled portion, except the end of a gate continuous to the underfilled portion, is closed with a release film 20, and in a state that the perimeter of the underfilled portion is closed, the sealing resin 14 having been supplied to a pot 42 provided in the mold is fed under pressure to the underfilled portion, to thereby fill the underfilled portion.

9 Claims, 10 Drawing Sheets

RESIN SEALING METHOD FOR A SEMICONDUCTOR DEVICE

BACKGROUND OF THE INVENTION

1. Field of the Invention

The present invention relates to a resin sealing method and apparatus for a semiconductor device. More particularly, the invention relates to a resin sealing method and apparatus which are well adaptable for the resin sealing of a semiconductor device having an underfill structure, e.g., a semiconductor device including a flip-chip connected semiconductor chip.

2. Description of the Related Art

A semiconductor device having a semiconductor chip mounted by a flip chip method is shown in FIG. 16. As shown, a semiconductor chip 12 is flip-chip connected onto a substrate 10, and then a joining portion between the semiconductor chip 12 and the substrate 10 is filled with sealing resin 14, to thereby seal the joining portion by resin. The sealing resin 14 functions to protect the joining portion between the semiconductor chip 12 and the substrate 10 and to relieve a thermal stress caused by the thermal coefficient difference of expansion between the substrate 10 and the semiconductor chip 12.

A known method of filling the joining portion with resin 14, generally used, is shown in FIG. 17. As shown, the substrate 10 is slantly supported, and in this state, sealing resin 14 is allowed to flow into the joining portion between the substrate 10 and the semiconductor chip 12. A number of solder bumps 16 are studded on the joining portion between the substrate 10 and the semiconductor chip 12. The sealing resin 14 flows through gaps among those bumps 16. To make the flow of the sealing resin easy, the substrate 10 is slanted, and the sealing resin 14 flows onto the slanted substrate 10 while expelling air from the joining portion.

When the sealing resin 14 is allowed to merely flow into the joining portion of the flip-chip connected semiconductor chip 12 to fill out there, the sealing resin 14 imperfectly fills the joining portion between the semiconductor chip 12, and sometimes the substrate 10 and air bubbles are left in the gap portion. Actually, the width of the joining portion (between the semiconductor chip 12 and the substrate 10) is about 0.1 mm, and recently it is reduced from 0.1 mm to 0.02 mm to 0.03 mm, extremely narrow. A number of solder bumps 16 are studded in the joining portion, and those bumps restrict the flow of the sealing resin 14. When the filler-contained resin is used, the resin flow is further impeded. Therefore, the method of merely flowing the sealing resin 14 into the underfilled portion cannot achieve the reliable sealing. A resin hardening time in the potting process is longer than in the transfer molding process. Therefore, also in the work efficiency, the method by merely flowing the sealing resin 14 into the underfilled portion is not preferable.

The solder bumps are minutely different in height and the semiconductor chips are also minutely different in thickness with the pieces to be molded. Therefore, when the transfer molding is used for sealing flip-chip connected semiconductor chip by resin, the following disadvantages are present: 1) a thin layer of resin will be formed on the outer surface of the semiconductor chip; and 2) the resin excessively presses the molded piece to possibly break the molded piece. Further, the resin material including extremely small silica particles or not including the same must be used since the gaps in the underfilled portion are extremely small. Such a resin material is easy to enter the gaps. Therefore, if the clamping of the molded piece is not properly, the resin will enter the gaps to form resin flash. The same disadvantageous phenomenon occurs also when the semiconductor chip is minutely displaced (when viewed in plan) on the substrate. For this reason, it is almost impossible to resin seal the underfilled portion resulting from the flip-chip connection by the conventional transfer molding process.

SUMMARY OF THE INVENTION

Accordingly, an object of the present invention is to provide a resin sealing method for sealing a semiconductor device with resin which is improved such that a transfer molding process is used for manufacturing a semiconductor device having an underfill structure, e.g., a semiconductor device including a flip-chip connected semiconductor chip, and the use of the transfer molding process provides a reliable underfilling free from air bubbles and produces a reliable semiconductor device, and an efficient underfilling process is provided.

Another object of the invention is to provide a resin sealing apparatus achieving the same improvements as by the resin sealing method.

To achieve the above object, the present invention has the following constructions:

A resin sealing method for a semiconductor device for sealing a molded piece including a semiconductor chip with resin by a transfer molding process in a state that the molded piece is clamped by a mold, the method comprises the steps of:

covering a clamping surface of the mold for clamping the molded piece and sealing resin material with a release film;

clamping the molded piece and sealing resin material with the release film placed therebetween, and clamping the resin material through an urging means for urging the resin material in the mold closing direction; and feeding molten resin to the molded piece under pressure by the urging force of the urging means, thereby filling the molded piece with the resin material.

In the resin sealing method, the resin material takes the form of a cylindrical resin tablet, and the resin tablet is placed while being laid down on the clamping surface of the mold, whereby the resin filling is performed.

A resin sealing apparatus for a semiconductor device for sealing a molded piece including a semiconductor chip with resin by a transfer molding process in a state that the molded piece and sealing resin material are clamped by a mold, through a release film covering a clamping surface of the mold, the resin sealing apparatus is characterized in that a mold portion of the mold for clamping the resin material is supported movably in the mold opening and closing directions, and urged in the mold closing direction by an urging means so as to be able to feed molten resin under pressure.

In the resin sealing apparatus, the surface of the mold portion for pressing the resin material is arcuately curved inward in cross section, the resin material being laid down on the surface of the mold portion.

Further, the mold portion is a cull insert with a spring as the urging means, and a center block is fixed at a location opposed to the cull insert.

A resin sealing method for sealing a joining portion between a semiconductor chip and a substrate by feeding pressurized sealing resin to an underfilled portion of a molded piece in which a semiconductor chip is mounted on a substrate, thereby sealing the joining portion, the method is characterized in that when the molded piece is clamped with a mold, the perimeter of the underfilled portion, except a portion to which a gate continuous to the underfilled portion is connected, is closed with a release film, and in a state that the perimeter of the underfilled portion is closed, the sealing resin is fed under pressure to the underfilled portion, to thereby fill the underfilled portion.

In the resin sealing method, when the underfilled portion is closed by the release film, the film is pressed against the side face of the semiconductor chip, whereby only the interior of the underfilled portion is filled with the sealing resin.

Further, when the underfilled portion is closed by the release film, the film is pressed against the side face of the semiconductor chip, through an elastic member elastically deformable when it receives a clamping force for clamping the molded piece.

When the underfilled portion is closed by the release film, the sealing resin fills out side-face sealing portions provided between the side faces of the semiconductor chip and the release film, and the underfilled portion.

When the underfilled portion is filled with the sealing resin, the side face of the semiconductor chip to which the gate is to be connected and the side face thereof opposed to and parallel to the gate-connecting side face are both closed by the release film.

When the underfilled portion is filled with the sealing resin, a pulsative motion is applied to the sealing resin.

A resin sealing apparatus for a semiconductor device in which a molded piece having a semiconductor chip carried on a substrate is clamped with the top half and the bottom half of a mold, and pressurized sealing resin is fed to an underfilled portion of the molded piece, thereby filling out the underfilled portion, the apparatus is characterized in that the semiconductor chip is located on the top half or the bottom half, and a cavity recess is provided for closing the side faces of the molded piece, except the side face thereof including the end of a gate continuous to the underfilled portion, are closed by use of a release film.

In the resin sealing apparatus, an elastic member is provided on side surface of the cavity recess, when the molded piece is clamped, the elastic member is elastically deformed by a clamping force produced to press the release film against the side face of the semiconductor chip.

Further, the resin sealing apparatus further comprises pulsating means for pulsating the sealing resin when the pressurized sealing resin is fed to the underfilled portion.

DETAILED DESCRIPTION OF THE PREFERRED EMBODIMENTS

Now, a description will be given in more detail of preferred embodiments of the present invention with reference to the accompanying drawings.

A resin sealing apparatus, which is a preferred embodiment of the present invention, will be described with reference to the accompanying drawings. The resin sealing apparatus fills, with sealing resin, a gap portion (underfilled portion) of the jointing portion between the substrate 10 and the semiconductor chip 12 in a piece 40 to be molded (molded piece), which is carried on a carrier substrate 10 by the flip chip connection, by a transfer molding process using a release film (FIG. 1).

The "release film" means a film having a heat resistance high enough to endure the heating temperature of a semiconductor mold and such a releasability as to allow the resin to release from the mold, and such a flexibility as to be expandable and deformable in conformity with a configuration of a mold face having a cavity or impression. A method in which in the process of resin sealing, the mold face is covered with a release film is called a "resin sealing method using a release film". Examples of the release film are ETFE, PTFE, PET, FEP, polyvinylidene chloride, and fluorine-contained glass cloth, and a thickness of the release film is 25 μm or less.

In the transfer molding process using the release film, the mold face is covered with the release film. Because of this, there is no chance that the resin directly contacts with the mold face. Therefore, a molded piece is easily released from the mold; the mold is simplified; and a resin material most suitable for a product or piece to be molded may be selected while having no regard for the releasability of the molded piece into consideration.

Figure 1:
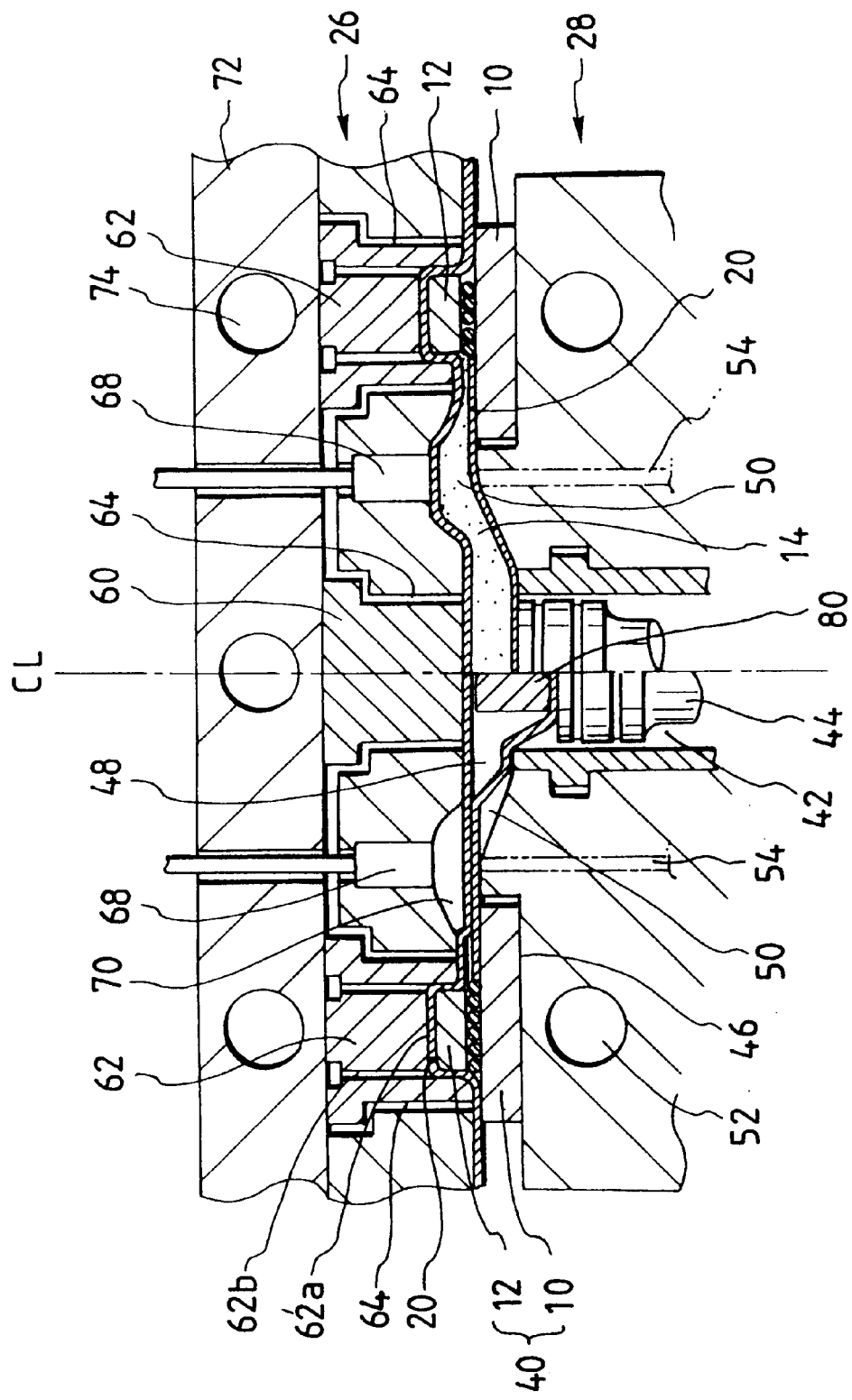
FIG. 1 is a sectional view showing a semiconductor mold in a resin sealing apparatus.

FIG. 1 is a sectional view showing a semiconductor mold in a resin sealing apparatus for sealing a molded piece 40 by resin.

In the figure, the left half portion of the illustration with respect to the center line CL shows a state of the molded piece 40 being clamped with the top half 26 and the bottom half 28 of the mold. The right half portion with respect to the center line CL shows a state that a gap portion (underfilled portion) of the joining portion of the semiconductor chip 12 and the carrier substrate 10 is filled with sealing resin.

Molded pieces 40 are respectively disposed on both sides of a pot 42 of the illustrated mold. Sealing resin which is molten within the pot 42 is transferred, under pressure, to the underfilled portion of each molded piece 40 by a plunger 44. Reference numeral 46 is a set recess used for setting the molded piece 40 at a predetermined location of the bottom half 28 of the mold. Numeral 48 is a molding cull, and numeral 50 is a mold runner communicating with the pot 42. Numeral 52 is a heater for heating the bottom half 28, and numeral 54 is an air absorbing hole for attracting a release film 20 that is set on the bottom half 28 onto the parting face of the bottom half 28, by air absorption.

The top half 26 of the mold includes a cull insert 60 located facing the pot 42, and cavity inserts 62 located so as to be able to clamp the molded piece 40. A cavity recess 62a for receiving a semiconductor chip 12 carried on the substrate 10 is formed in the parting face of the cavity insert 62. When the molded piece 40 is clamped, the cavity recess 62a tightly presses the side faces of the semiconductor chip 12 in such a way that the release film 20 is placed between the cavity recess and the side faces of the chip.

To set the cavity insert 62 to the top half 26 of the mold, it is inserted through a set hole formed in the top half 26, from the rear side of the top half 26. A gap, which will serve as an air passage 64, is formed connecting from the inner wall of the set hole of the top half 26 to the side surface of the cavity insert 62. The air passage 64 attracts, by air absorption, a release film 20 that is set on the parting face of the top half 26, onto that parting face. Numeral 66 is an air passage which is provided in the side surface of the cull insert 60 in order to attract the release film 20 to the cull portion by air attraction. Numeral 62b is an absorption hole for attracting the release film 20 onto the inner surface of the cavity recess 62a by air absorption.

The parting face of the top half 26 is substantially entirely covered with the release film 20, and the inner surface of the cavity recess 62a of the cavity insert 62 is also covered with the release film 20. Therefore, the dimension of the cavity recess 62a of the cavity insert 62 is so selected that it can receive a semiconductor chip 12 in a state that the cavity recess 62a is covered with the release film 20.

Numeral 68 indicates ultrasonic vibrators installed in the top half 26 of the mold. Each ultrasonic vibrator 68 is disposed in alignment with the position of a gate 70. The ultrasonic vibrator 68 vibrates resin passing through the gate 70 to reliably filling the underfilled portion with resin. In case where the sealing resin contains filler, the operation of the ultrasonic vibrator 68 is effective for filling the underfilled portion with the resin. No resin enters the ultrasonic vibrator 68 because of presence of the release film 20, and hence is stable in its operation.

The inner surfaces of the resin flowing paths, e.g., the gate 70, are covered with the release film 20, to thereby provide an easy flow of resin in the resin paths in the process of filling the underfilled portion with resin, and hence to enhance the fill-out of the underfilled portion by resin. Numeral 74 is a heater provided in the base 72 of the top half 26.

A resin sealing operation of the resin sealing apparatus with the thus constructed mold will be described.

To start with, in a mold opened state, molded pieces 40 are put in the set recess 46 of the bottom half 28.

Then, a release film 20 is supplied to the parting face between the top half 26 and the bottom half 28 by use of a film supply mechanism. In supplying a release film 20 to the mold, the film is somewhat lifted above the parting face of the mold; moved to a predetermined position within the mold; and air is sucked through the air absorbing hole 54 and the air passages 64 and 66, those connecting to the film supply mechanism, so that the release film 20 is attractively supported on the parting face.

In the embodiment, the release film 20 to be supplied to the bottom half 28 has a width large enough to range from the pot 42 to the gate-side ends of the molded pieces 40, placed on both sides of the pot. The molded pieces 40 are set to the bottom half 28 of the mold, and then the release film 20 is set to the same. As a result, the opening portion of the pot 42 is closed by the release film 20, and further, a region up to the gate-side ends of the substrates 10 of the molded pieces 40 are covered with the release film 20.

When portions on the substrate 10 where the gates 70 pass are covered with the release film 20, resin passing the gates 70 does not contact with the surface of the substrate 10. The fill-out by the resin ends and is hardened, and when the hardened resin is removed, there is no chance of damaging the surface of the substrate 10.

Where attachment of the underfilling resin onto the surface of the substrate 10 is allowed, there is no need of extending the release film 20 up to the substrate 10 for covering there, as a matter of course. Where the sealing resin is attached to the surface of the substrate 10 for the underfilling, it is suggestible that portions having good releasability from the sealing resin, e.g., a metal plated portion, are provided in the portions passed by the gates 70.

After the release film 20 is set to the parting face between the bottom half 28 and the top half 26, a resin tablet 80 for underfilling is supplied to the pot 42 of the bottom half 28, and then the molded pieces 40 are clamped with the top half 26 and the bottom half 28. When the resin tablet 80 is supplied to the pot 42, the opening portion of the pot 42 is closed with the release film 20; however, it is inserted into the pot 42 when the molded pieces 40 are clamped. The release film 20 is easily put into the pot 42 since the release film 20 is satisfactorily expandable and flexible. It is preferable that the resin tablet 80 is horizontally placed since an easy expansion of the release film 20 is allowed.

After the resin tablet 80 is molten in the pot 42, the plunger 44 is driven to push up the molten resin; the molten resin flows the mold runners 50 and the gates 70; and reaches the underfilled portion and fills the underfilled portion.

In the embodiment mentioned above, the sealing resin to be supplied to the pot 42 takes the form of a tablet. If required, it may take form of granule, powder, or liquid resin, or lapping resin.

In case where the granule, powder, or liquid resin is used, air is sucked from the pot 42 in a state that the opened face of the pot 42 is covered with the release film 20, whereby the release film 20 is attracted along the inner surface of the pot 42 and the upper surface of the plunger 44 to form a recess for sealing resin. Where liquid resin is used, resin is easy to enter a gap between the plunger 44 and the inner surface of the pot 42. In this respect, use of the release film 20 is very useful.

The "lapping resin", formed with a lapping film, consists of a container containing a predetermined amount of resin, shaped so as to be received by the pot 42, and extended portions extended from both sides of the container. Two sheets of lapping films are laminated to sealingly form the extended portions. When resin pressure is applied to the extended portions, those laminated portions are separated from each other, and the resin flows outside through the space between the separated lapping films, from the container.

In the event that the lapping resin is set to the pot 42 such that the ends the extended portions of the lapping resin are positioned at the gate end positions of the molded pieces 40, the underfilling is effected which is comparable with that in the above-mentioned embodiment, without setting the release film 20 to the bottom half 28. Liquid resin may be used for the resin to be contained in the container of the lapping resin.

Figure 2:
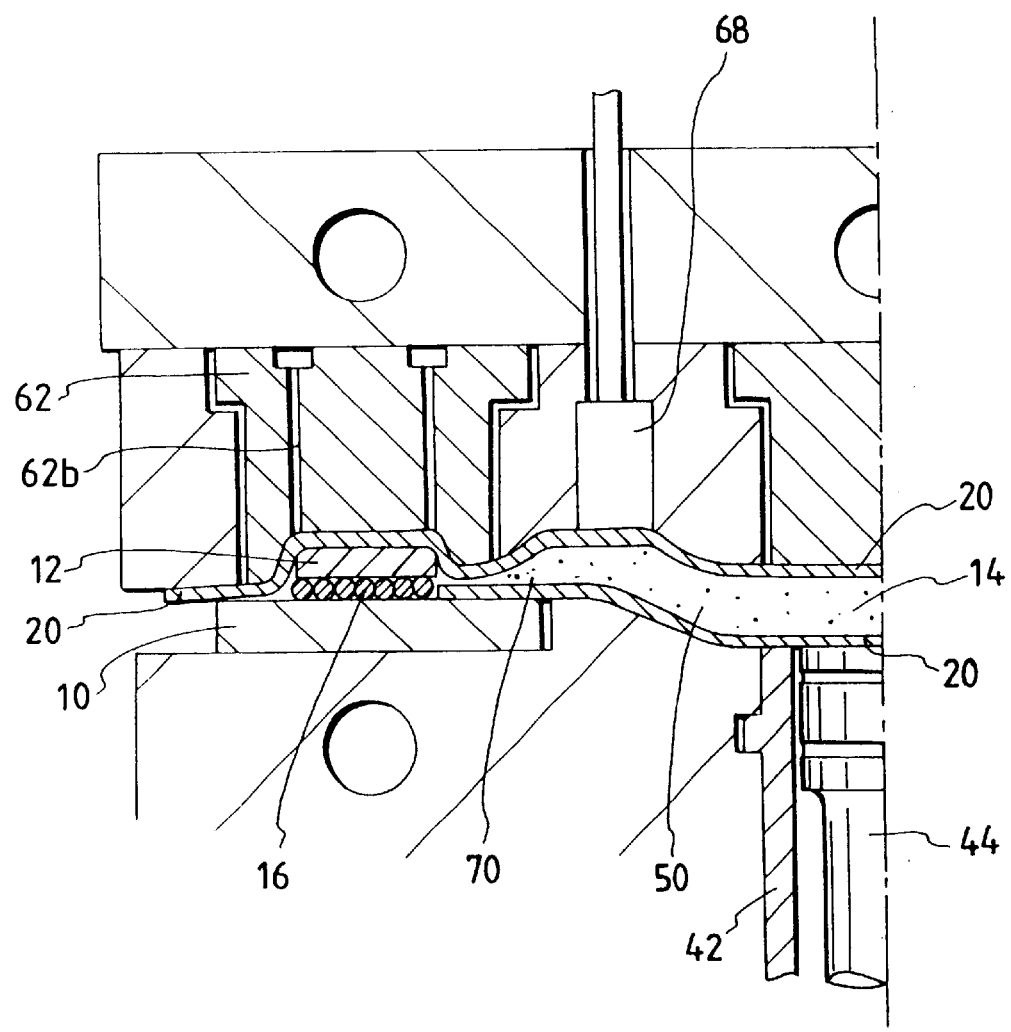
FIG. 2 is an explanatory diagram showing a state that an underfilled portion of a molded piece is filled with sealing resin.

FIG. 2 is an explanatory diagram showing a state that the underfilled portion of a molded piece 40 is filled with sealing resin. In a region including the mold runner 50 and the gate 70, a pressure by the sealing resin 14 transferred under pressure from the pot 42 presses the release film 20 against the inner wall of the mold. Therefore, in the precess of filling the underfilled portion with the sealing resin 14, there is no chance that the sealing resin 14 contacts with the inner wall of the mold. The end of the gate 70 is connected to the opening end of the gap between the semiconductor chip 12 and the substrate 10. With this connection, the sealing resin 14 is fed to the underfilled portion, from the gate 70.

A space surrounding the upper surface and the side face of the semiconductor chip 12, and the joining portion (underfilled portion) between the semiconductor chip 12 and the substrate 10, except a portion continuous to the gate 70, are closed by the release film 20. With this structure, the sealing resin 14 is injected through the gate 70 into the underfilled portion, to effect the fill-out of this portion.

Thus, the resin sealing method of the embodiment clamps the molded piece 40 by the mold, and injects the sealing resin 14 into the underfilled portion by pressurizing the sealing resin 14 by the plunger 44, whereby the fill-out of the underfilled portion by the sealing resin is effected. The resin sealing method can more reliably seal the underfilled portion than the conventional resin sealing method in which the sealing resin is allowed to merely flow into the underfilled portion.

In this method where the sealing resin is pressurized by the plunger 44, and the underfilled portion is filled with the pressurized resin, air is easy to discharge from the underfilled portion since the resin pressure is applied to the underfilled portion, and the pressurized resin acts to depress the residual air. As a result, a reliable resin sealing with little voids is realized.

Even when the gap between the semiconductor chip 12 and the substrate 10 is further narrowed, the resin sealing method using the pressurized resin for the fill-out of the underfilled portion can realize a reliable resin sealing.

In the method in which the underfilling is carried out by use of the release film 20, the molded piece 40 is clamped in a state that the release film 20 is placed between the molded piece 40 and the parting face of the mold. Therefore, the release film 20 protects the outer surface of the semiconductor chip 12, and there is no chance that the clamping force will break the semiconductor chip 12. The clamping of the molded piece with the insertion of the release film 20 between the molded piece and the mold enhances the sealing performance, and eliminates the formation of the flash of the underfilling material on the outer surface of the semiconductor chip 12. The mold piece clamping with the release film insertion enhances the sealing of the underfilled portion. As a result, there is no chance that the flash of the underfilling material is formed on the substrate 10 carrying the semiconductor chip 12.

The gate 70 may be connected to the underfilled portion by 1) connecting the gate to a proper position on the side of the gate 70 to which the gate is to be connected, or 2) connecting the gate to the entire side (gate end) of the gate 70 to which the gate is to be connected. The second gate connecting method is advantageous in that an efficient injection of the sealing resin into the underfilled portion is possible.

After the fill-out of the underfilled portion by the sealing resin is completed and the sealing resin is hardened, the mold is opened, and the molded pieces sealed with resin are taken out of the mold. The underfilling process under the condition of the insertion of the release film 20 provides an easy releasing of the molded pieces. Therefore, only the molded pieces may be taken out by releasing the release film 20 from the molded pieces.

In the next underfilling process, the mold is opened, molded pieces 40 are set on the bottom half 28 of the mold, and a new release film 20 is set on the parting face between the top half 26 and the bottom half 28. In this way, the molded pieces are successively sealed with resin by the transfer molding process using the release film.

The resin sealing apparatus described above fills the underfilled portion of the molded piece 40 with resin while applying the resin pressure to the underfilled portion. Therefore, the cavity recess 62a is formed in the parting face of the cavity insert 62 of the top half 26 of the mold, and the underfilled portion is closed by surrounding the underfilled portion by the release film 20.

Figure 3:
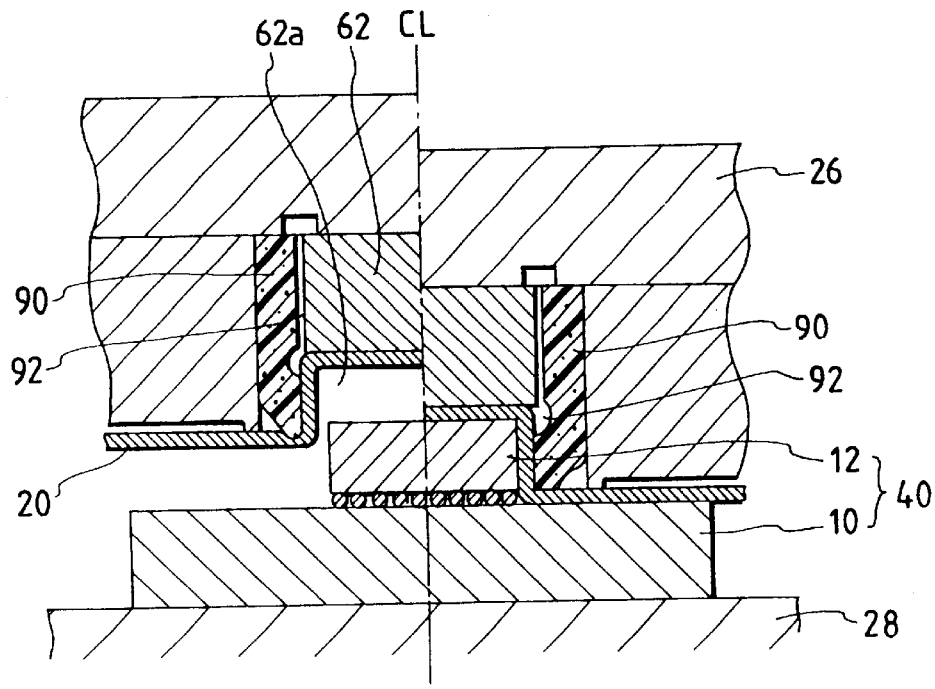
FIG. 3 is an explanatory diagram showing another structure of the semiconductor molding for surrounding and closing the underfilled portion of a molded piece by a release film.

FIG. 3 is an explanatory diagram showing another structure of the semiconductor mold for surrounding and closing the underfilled portion of the semiconductor chip by the release film 20. In the illustration of FIG. 3, the left half with respect to the center line CL shows a state that a molded piece 40 is not yet clamped, while the right half shows a state that the molded piece 40 is clamped.

Also in the structure of FIG. 3, a cavity insert 62 for receiving a semiconductor chip 12 is provided. This structure is different from the previous structure in that an elastic member 90 of silicone rubber, for example, is additionally located at a portion of the structure where it contacts with the side face of the semiconductor chip 12. The elastic member 90 functions as follows: when the molded piece 40 is clamped with the top and bottom halves of the semiconductor mold, the resultant clamping force presses the elastic member 90 inwardly, and in turn the pressed elastic member presses the release film 20 against the side face of the semiconductor chip 12 and further against the upper surface of the substrate 10.

The right half with respect to the center line CL in FIG. 3 shows a state the perimeter of the underfilled portion of the molded piece is closed with the release film 20 with the aid of the elastic member 90. Where the molded piece of which the underfilled portion includes extremely small gaps is sealed with sealing resin, it is essential to reliably seal the underfilled portion. Such a reliable sealing can be achieved by use of the elastic member 90. The FIG. 3 structure additionally uses an air passage 92 formed at a location between the inner surface of the elastic member 90 and the side surface of the cavity insert 62. The air passage 92 functions such that when the molded piece 40 is clamped, air pressure is applied to the elastic member 90 through the air passage 92, to thereby reinforce the pressing force by the elastic member 90 and hence to more reliably close the underfilled portion.

Figure 4:
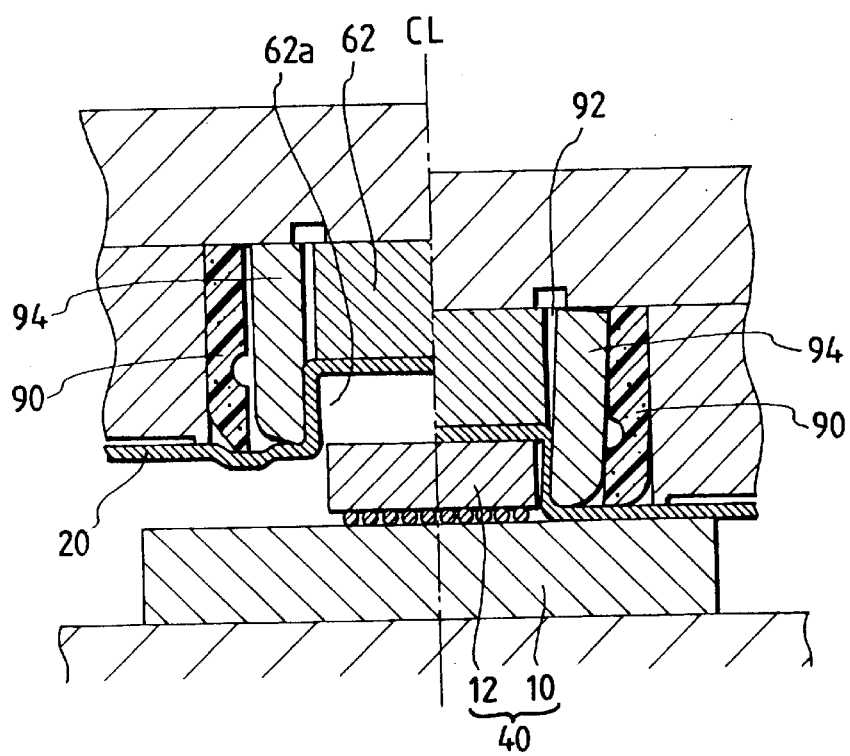
FIG. 4 is an explanatory diagram showing yet another structure of the semiconductor molding for surrounding and closing the underfilled portion of a molded piece by a release film.

FIG. 4 is an explanatory diagram showing another structure of the semiconductor mold for surrounding and closing the underfilled portion of the semiconductor chip by the release film with the aid of the elastic member 90. In the illustration of FIG. 4, the left half with respect to the center line CL shows a state that a molded piece 40 is half opened, while the right half shows a state that the molded piece 40 is clamped. In the FIG. 4 structure, the cavity recess 62a of the cavity insert 62 includes a side structure formed with a metal pressure member 94 and an elastic member 90 of, for example, silicone rubber. When the molded piece 40 is clamped, the metal pressure member 94 concentrates a pressing force onto in particular the side face of the underfilled portion. The elastic member 90 augmentatively assists the holding of the side of the underfilled portion by the metal pressure member 94, and presses the release film 20 onto the upper surface of the substrate 10.

The FIG. 4 structure also advantageously operates when the molded piece of which the underfilled portion includes extremely small gaps is sealed with sealing resin: it ensures a reliable fill-out of the underfilled portion by the resin, and provides a reliable resin sealing of the molded piece or semiconductor device. Also in this structure, with application of air pressure through the air passage 92, the release film 20 is reliably pressed against the side face of the semiconductor chip 12, thereby enhancing the closing of the underfilled portion.

Other possible means to close the perimeter of the underfilled portion are: 1) a block is mechanically moved by a drive means, e.g., a cylinder, to close the perimeter of the underfilled portion, and 2) air is fed through the absorption hole 62b to close the perimeter of the underfilled portion. In the event of closing the perimeter of the underfilled portion, the four side faces of the semiconductor chip 12 may be all closed. Alternatively, the two side faces of the same are closed, but the side face thereof to be connected to the gate 70 and the side face opposite to the former are not closed.

The resin sealing method and the resin sealing apparatus, which are constructed according to the present invention, have been described specifically. In the invention, the perimeter of the underfilled portion of the molded piece 40 is closed with the release film 20, and the underfilled portion is filled with the sealing resin while applying resin pressure to the underfilled portion by the transfer molding process. In this case, the utilization of the ultrasonic vibrator more ensures a reliable underfilling process. In an alternative, a resin pressure produced when the sealing resin is extruded by the plunger 44 is controlled so as to secure a reliable resin sealing.

Figure 5:
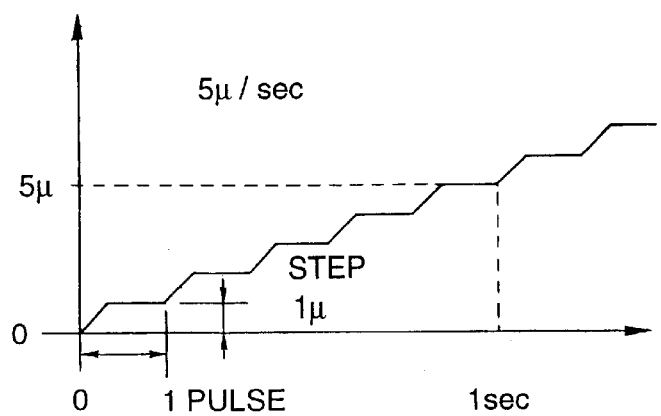
FIG. 5 is a graph showing a stepwise movement of a plunger for controlling the resin filling process.

This alternative follows. The plunger 44 presses the resin to move it to the underfilled portion. In this case, the operation of the plunger 44 is controlled in a stepwise fashion as shown in FIG. 5; the resin is extruded in a pulsative manner by the plunger 44 to fill out the gaps of the underfilled portion. The pulsative feeding of the resin is equivalent to the resin feeding using the ultrasonic vibrator. Therefore, also in a case where the resin containing filler is used, a reliable underfilling is secured.

In the normal transfer molding process, the plunger 44 is continuously lifted to a given height position. Where the FIG. 5 control is used, the plunger 44 is stepwise lifted, so that the resin is forcibly vibrated. Therefore, the resin enters a region including obstructive objects, e.g., solder bumps 16, to perfectly fill out the spaces therein. Even in case where the gaps of the underfilled portion are extremely small and the filling of the gaps with the resin is difficult, the FIG. 5 resin-pressure control can satisfactorily fill out such small gaps of the underfilled portion.

Where the filling of the underfilled portion is performed while pulsating the resin pressure, a velocity of the flow of the resin is large. Because of this, in the case of using the filler contained resin, the filler particles may be uniformly distributed in the resin without any separation of the filler from the resin. Further, large diameter filler particles and small diameter filler particles are distributed uniformly.

In case where the velocity of the resin flowing through the underfilled portion is 1 mm/sec, the lifting velocity of the plunger 44 is about 5 $\mu$m/sec. The graph of FIG. 5 shows a case that the plunger 44 is lifted at five steps a distance of about 5 $\mu$m for the period of 1 (one) second. The lifting motion of the plunger 44 may be controlled properly. When a servo motor drive system, for example, is used for driving the plunger 44, control parameters for the servo motor drive system are set at proper values in advance.

The method for controlling the resin filling process using the plunger 44 in FIG. 5 may be used in combination with the method using the ultrasonic vibrator or one of those control methods may be used.

For the resin filling process, the plunger 44 may be controlled such that it is moved in the normal manner for feeding the sealing resin 14 in the range from the pot 42 to the gate end, and it is moved in the stepwise manner for feeding the sealing resin 14 in the range from the gate end to the underfilled portion.

Figure 16:
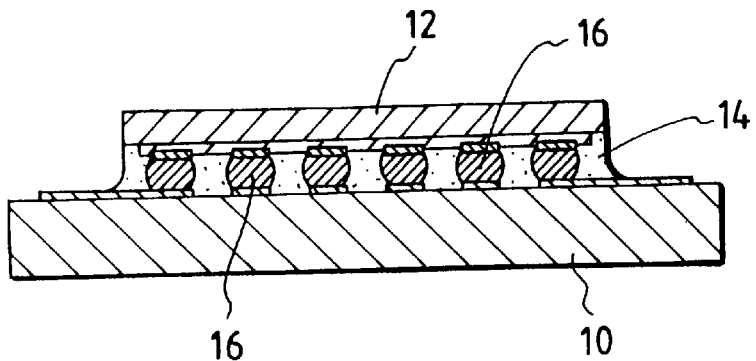
FIG. 16 is a cross sectional view showing a semiconductor device sealed by underfilling.
Figure 17:
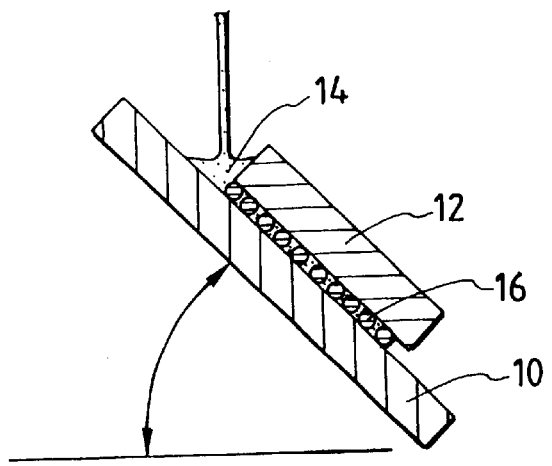
FIG. 17 is an explanatory diagram showing a conventional method for filling a gap portion between a semiconductor chip and a substrate with resin.

The semiconductor device that is sealed with the resin by the resin sealing apparatus described above is as shown in FIG. 16. As shown, the sealing resin 14 is not attached to the side faces of the semiconductor chip 12, and only the joining portion between the semiconductor chip 12 and the substrate 10 is filled with the sealing resin 14. There are semiconductor devices of the type in which the sealing resin is applied to other portions than the joining portion of the semiconductor chip 12. In one semiconductor device of this type, a small amount of sealing resin 14 is left on the side faces of the semiconductor chip 12. In another semiconductor device, the sealing resin 14 entirely covers all the side faces of the semiconductor chip 12 (FIG. 18).

When the resin sealing apparatus as mentioned above is used for resin sealing the semiconductor product of which the side faces of the semiconductor chip 12 are sealed with the sealing resin 14, the following problem arises. The resin flows to the side faces of the semiconductor chip 12 earlier than it flows to the underfilled portion. As a result, the entire semiconductor device inclusive of the underfilled portion is imperfectly sealed with the resin.

Description to follow is elaboration of an apparatus and method for sealing the semiconductor product inclusive of the side faces of the semiconductor chip 12 with the sealing resin 14.

Figure 6:
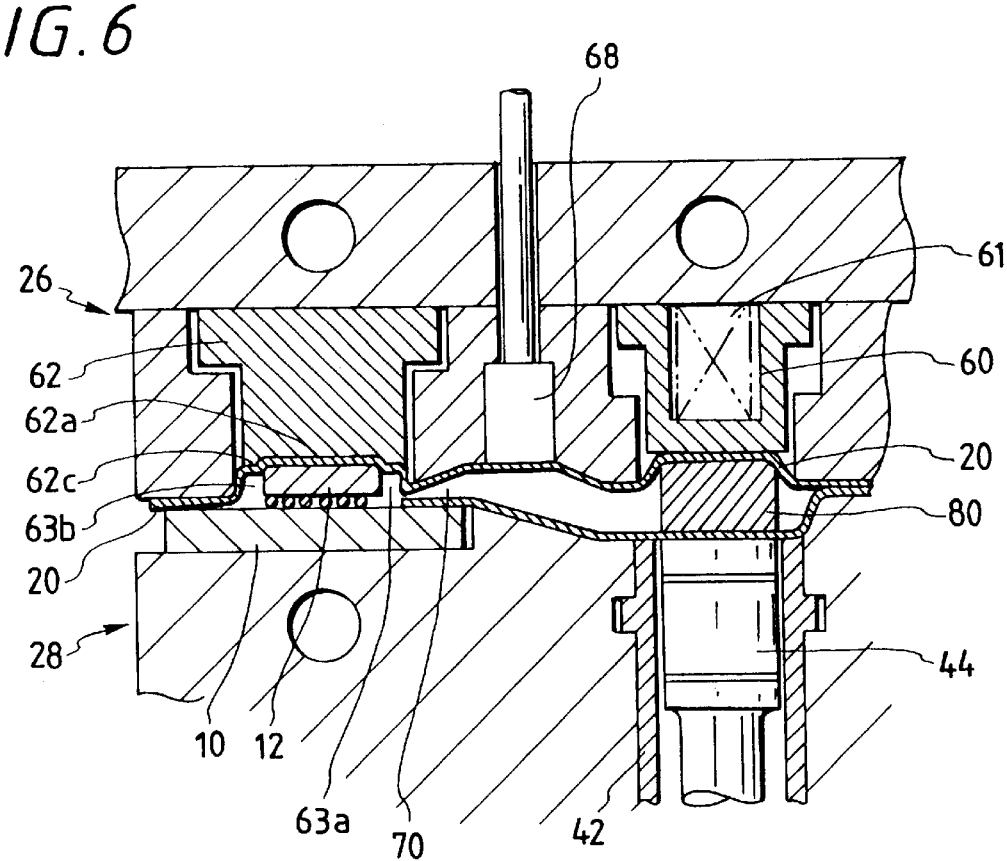
FIG. 6 is an explanatory diagram showing how to seal a semiconductor device with resin, with provision of side-face sealing portions.
Figure 18:
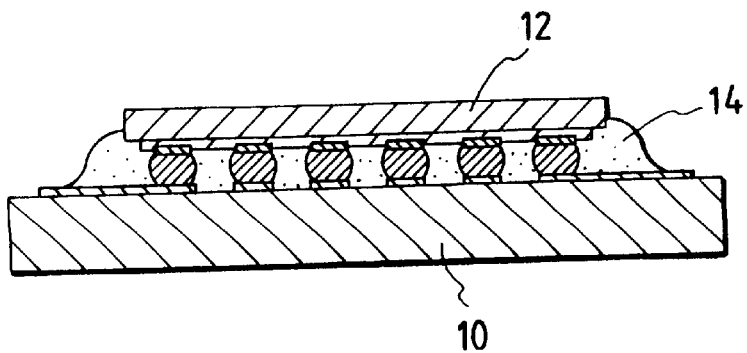
FIG. 18 is a cross sectional view showing another semiconductor device sealed by underfilling.

FIG. 6 is a cross sectional view showing a semiconductor mold of a resin sealing apparatus for manufacturing a semiconductor device as shown in FIG. 18. The resin sealing apparatus is uniquely structured for sealing the side faces of the semiconductor chip 12 with sealing resin: the side face of the cavity recess 62a of the cavity insert 62 has a stepped part 62c, and side-face sealing portions 62a, 62b, 62c and 62d are provided for the four sides of the semiconductor chip 12, respectively.

In the mold having, as described above, the side-face sealing portions 62a, 62b, 62c and 62d disposed surrounding the semiconductor chip 12 is used for sealing the semiconductor device, if the gate 70 is merely continuous to the side-face sealing portion 62a, the following problem arises in the resin sealing process. The sealing resin first fills the side-face sealing portions 62a, 62b, 62c and 62d around the semiconductor chip 12 where the resin is easy to flow, and insufficiently fills the gap portion (underfilled portion) between the semiconductor chip 12 and the substrate 10.

The width of the underfilled portion is approximately 0.1 mm. Therefore, in the mold where the gate 70 is merely connected to the side-face sealing portion 63a, the resin first fills the side-face sealing portions 63a, 63b, 63c and 63d around the semiconductor chip 12 where the resin is easy to flow, and then flows to the underfilled portion of the semiconductor device.

Figure 7:
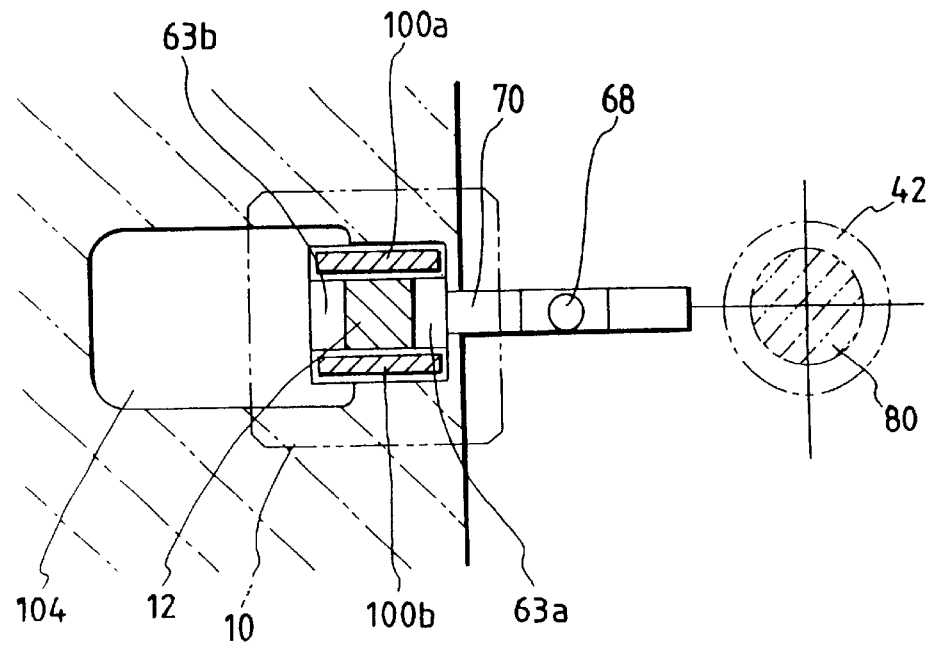
FIG. 7 is an explanatory diagram showing the top half provided with side blocks when viewed from the parting face side.

In order to sufficiently fill the underfilled portion with the sealing resin, the resin sealing apparatus under discussion uses side blocks 100a and 100b for sealing the two side faces of the semiconductor chip 12 adjacent to the side of the chip to which the gate 70 is to be connected, as shown in FIG. 7.

FIG. 7 is an explanatory diagram showing the top half 26 provided with side blocks when viewed from the parting face side. As shown, the gate 70 is extended from the pot 42 toward the molded piece, and connected to the side-face sealing portion 63a. The side blocks 100a and 100b close the entire sides of the semiconductor chip 12. Therefore, the sealing resin 14 fed under pressure through the gate 70 is forcibly injected into the gap portion between the semiconductor chip 12 and the substrate 10.

Figure 8:
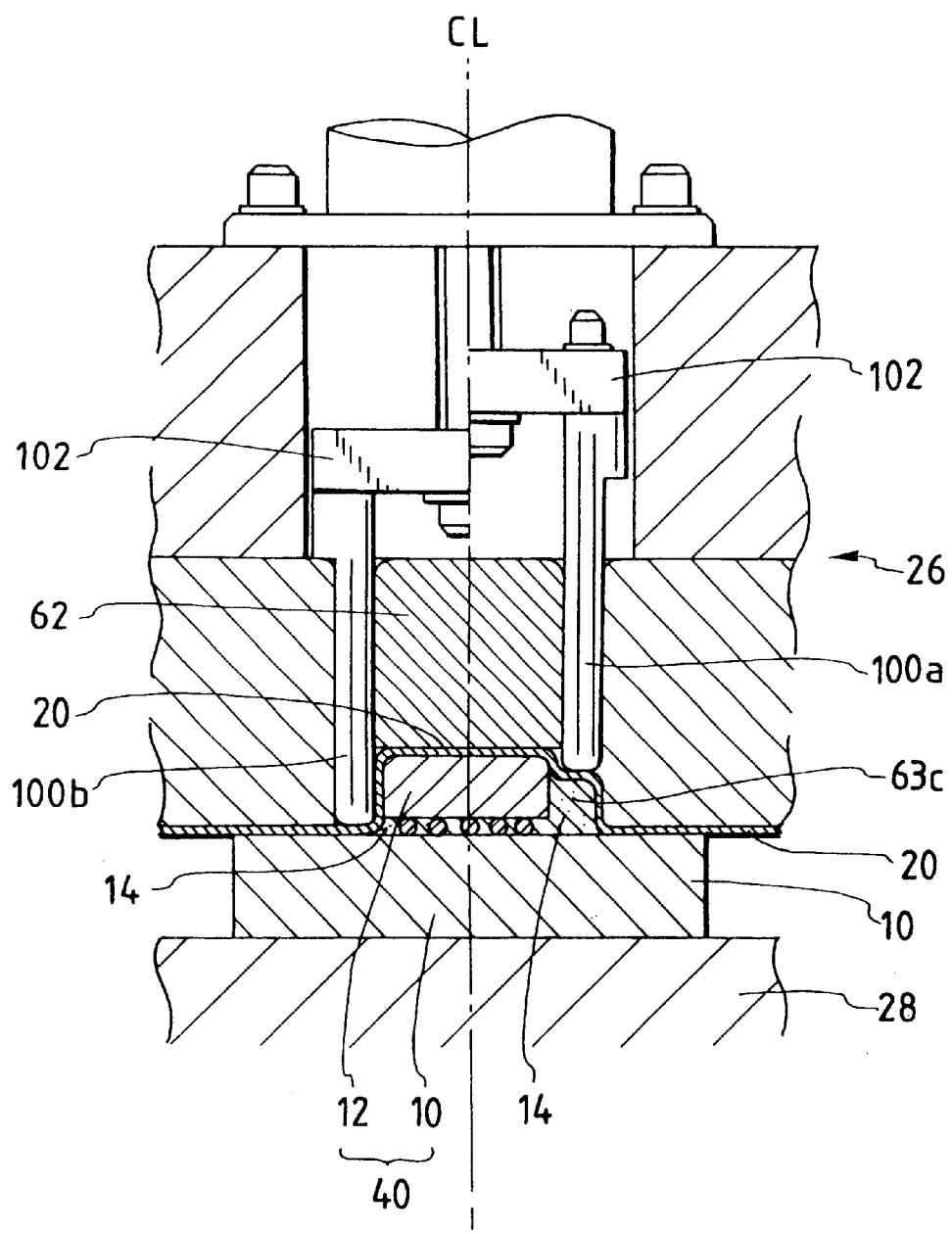
FIG. 8 is a cross sectional view showing a support structure of the side blocks in the mold when viewed from the gate side.

FIG. 8 is a cross sectional view showing the layout and a support structure of the side blocks 100a and 100b in the mold when viewed from the gate 70 side. In the figure, the left half portion with respect to the center line CL shows a state that the side face of the semiconductor chip 12 is closed with the side block 100b, and the gap portion between the semiconductor chip 12 and the substrate 10 is filled with the sealing resin 14. The right half portion shows a state that the sealing resin 14 is injected into the side-face sealing portion 63c to seal the side face of the semiconductor chip 12 by the sealing resin 14.

The side blocks 100a and 100b are supported by movable plates 102, respectively, such that those are vertically moved when the movable plates are driven by a drive mechanism including a cylinder, for example, to be vertically moved.

In the resin filling process, a molded piece 40 is first set to the bottom half 28; the side blocks 100a and 100b located on both sides of the semiconductor chip 12 are lowered when the molded piece 40 is clamped in a state that the release film 20 is applied to the molded piece, to thereby close both sides of the underfilled portion; and under this condition, the sealing resin is injected into the underfilled portion, from the gate 70.

Figure 9A:
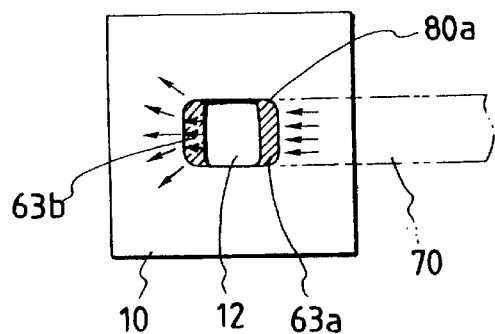
FIGS. 9A and 9B are explanatory diagrams showing how to underfill by use of the side blocks.

FIG. 9A shows the filling by the sealing resin 14 in a state that the side faces of the semiconductor chip 12 are closed by the side blocks 100a and 100b. The sealing resin 14 first fills the side-face sealing portion 63a (located on the front side), and then flows through the gap portion between the semiconductor chip 12 and the substrate 10 and fills the sideface sealing portion 63b (located on the rear side).

An air vent portion 104 is provided in the parting face of the top half 26, as shown in FIG. 7. With provision of the air vent portion 104, after filling out the side-face sealing portion 63b, the sealing resin 14 expels residual air left in the side-face sealing portions 63a and 63b and the underfilled portion, through the air vent portion 104, whereby the underfilling is carried out eliminating voids.

Figure 9B:
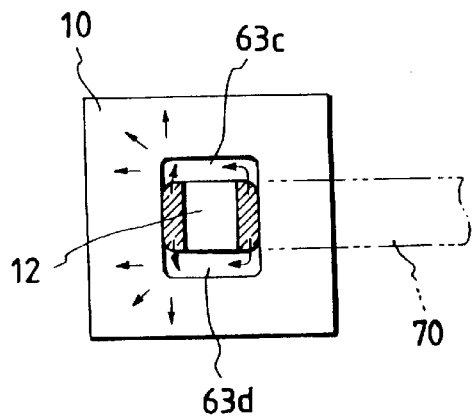

Upon completion of the filling of the underfilled portion with the resin, the side blocks 100a and 100b are lifted to allow the sealing resin 14 to be injected into the side-face sealing portions 63c and 63d through the gate 70. FIG. 9B shows a state that the side-face sealing portions 63c and 63d are filled with the sealing resin 14.

Thus, the semiconductor device in which the gap portion between the semiconductor chip 12 and the substrate 10 and the side faces of the semiconductor chip 12 are sealed with the sealing resin 14 can be manufactured by use of the resin sealing apparatus having the side blocks 100a and 10b.

The resin sealing apparatus is arranged so as to satisfactorily resin seal the entire molded piece, which has portions to be easily and hardly filled with the resin when the resin is fed from the gate 70 to the cavity, by controlling the flow of the resin at the portions to be filled with the resin. Such a resin sealing method is one of the resin sealing methods for reliably resin sealing the molded piece having portions to be easily and hardly filled with the resin.

The resin sealing apparatus may be operated in combination with the ultrasonic vibrator for vibrating the sealing resin 14 when the underfilling is performed or the method in which the resin pressure is stepwise varied (FIG. 5).

The mold shown in FIG. 6 is constructed such that the cull insert 60 is movable in the directions in which the mold is opened closed, and the end face of the cull insert may be projected above the parting face by a spring 61. In operation, a resin tablet 80 is supplied to the pot 42, and the mold is closed. Then, the cull insert 60 is pushed upward while resisting a resilient force of the spring 61 (FIG. 6). When the resin tablet 80 is molten, and the cull insert 60 is pushed downward by the spring 61, and the filling of the underfilled portion with the resin is completed. A molding pressure at the time of resin sealing is caused by the urging force of the spring 61. The plunger 44 of the bottom half of the mold functions to adjust the amount of resin, and to adjust the pressure. A spring force of the spring 61 may be about 5 kg, and a plunger pressure of the plunger 44 may be 30 kg. If those are so selected, the resin may be injected while melting the resin tablet.

One of the methods for providing a quick injection of resin is to clamp the resin tablet 80 with the cull insert 60 and the plunger 44; the plunger 44 is lifted to feed the molten resin; the upward motion of the plunger 44 is stopped immediately before the underfilled portion is fully filled with resin; and in this state, the underfilled portion is filled with the resin by the urging force of the cull insert 60. This method is advantageous in that no surging occurs and the resin flash is reduced.

The following resin sealing method may be used. The apparatus is designed such that the sealing resin 14 is fed up to the gate end when the cull insert 60 is lowered. When the sealing resin 14 is fed to the underfilled portion and the side-face sealing portions 63a, 63b, 63c and 63d, the movement of the plunger 44 is stepwise varied to pulsatively vary the resin pressure of the sealing resin 14. This resin sealing method corresponds to the resin sealing method based on the speed control of the plunger 44.

Figure 10:
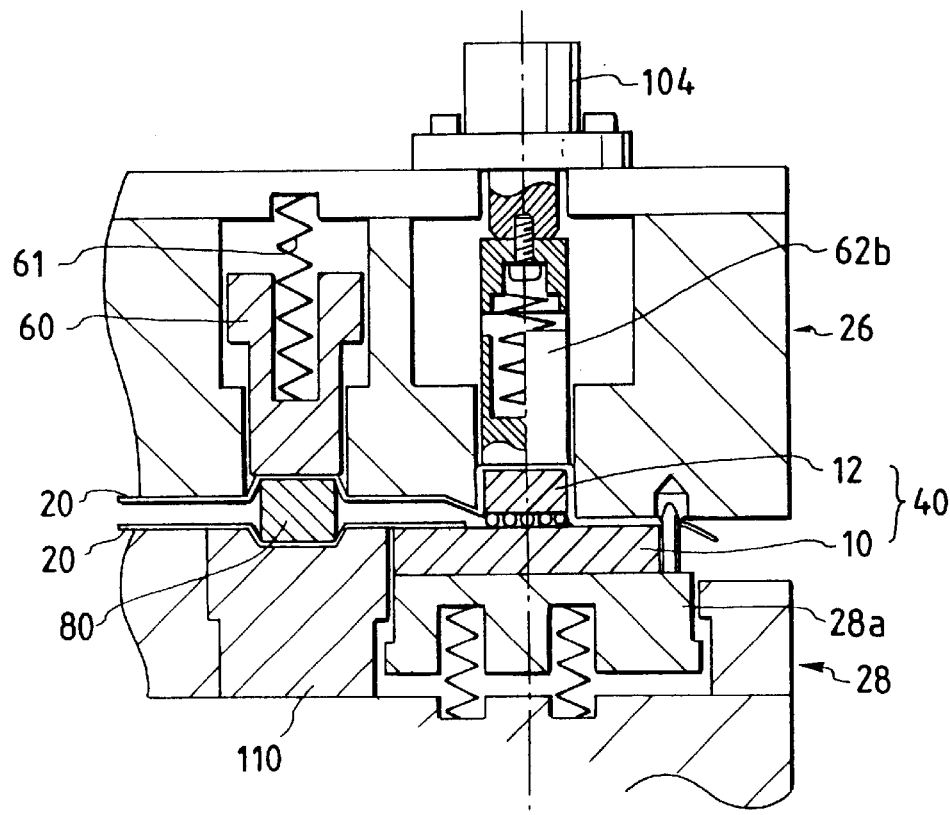
FIG. 10 is a cross sectional view showing another resin sealing apparatus.

FIG. 10 is a cross sectional view showing another resin sealing apparatus for sealing a molded piece including the underfilled portion with sealing resin. Also in this embodiment, the molding surfaces of the top half 26 and the bottom half 28 of the mold are covered with the release films 20 for the resin sealing purpose. In the resin sealing apparatus, the plunger 44 is not used which for feeding the molten resin tablet under pressure. As in the case of FIG. 6, the cull insert 60 is supported while being urged in the mold opening direction by the spring 61. A center block 110 is fixed to the pot side portion, which faces the cull insert 60.

Figure 11:
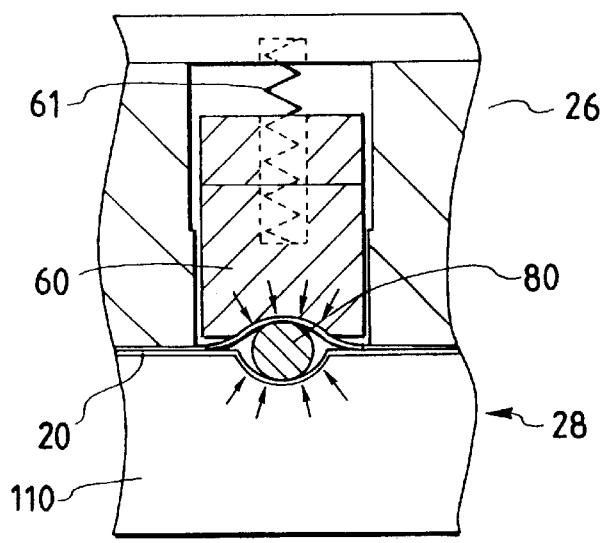
FIG. 11 is a cross sectional view showing a state that the resin tablet is compressed by the cull insert and the center block.

FIG. 11 is a cross sectional view showing the cull insert 60 and the center block 110 when viewed from their side. In this embodiment, the resin tablet 80 is set in the bottom half 28 in a state that it is laid down, and compressed for resin sealing with the cull insert 60 and the center block 110. Therefore, the clamping faces of the cull insert 60 and the center block 110, which vertically clamp the resin tablet 80, are arcuately and inwardly curved, as shown, in conformity with the cross section configuration of the cylindrical resin tablet 80.

The resin tablet is formed by compacting resin powder. Because of this, its density is low and its thermal conductivity is low. Heat exchange level is high in the surface of the resin tablet in contact with the mold, but it is considerably low in the core part of the resin tablet. In the conventional pressure molding system using the vertical pot and the flat plunger, it is known that the core part of the resin tablet is kept at its temperature before it is supplied to the mold for a long time till the resin tablet is molten.

If the resin tablet 80 is inserted between the thus configured clamping faces of the cull insert 60 and the center block 110, the pressurizing forces are directed toward the core part of the resin tablet 80. A density of the resin tablet 80 is increased; a thermal conductivity thereof is increased; and the resin tablet 80 is substantially simultaneously molten while keeping its density high. Temperature of the resin tablet 80 are substantially the same at the respective points thereof till it is molten. Accordingly, evaporation of and air discharging from the resin tablet 80 substantially concurrently take place, and terminate for a short time. As a result, the volume of each air bubble confined within the molten resin is extremely small and its diameter is also small. For this reason, there is no need of breaking the air bubbles by pressure applied thereto. A pressure necessary for the resin molding may be smaller than 15 atmospheres.

In the conventional pressure molding system using the vertical pot and the flat plunger, the resin, not yet molten, which is located at the core of the resin tablet, is encapsuled with the molten resin. Therefore, vapor and gas left in the resin, together with the resin, are injected into the cavity. Therefore, the air bubbles need to be broken into small bubbles of satisfactory size within the cavity. For this reason, a large molding pressure of 100 atmospheres is used for resin molding by the conventional technique.

On the other hand, the resin sealing method of the invention can effect the resin sealing at much smaller molding pressure than the above one: it can fill the underfilled portion with the resin by only the urging force generated by the spring 61 of the cull insert 60.

The resin sealing method which utilizes the urging force of the spring 61 for underfilling is very useful also in the following points. In the resin sealing method in which the resin tablet is pressed by use of the mechanically driven plunger and molten, the plunger presses the resin tablet being still solid at a programmed plunger speed. Therefore, the solid resin tablet is broken to form spaces among the broken tablet pieces, and air enters the spaces. At the same time, the resin is rapidly softened, but the plunger motion fails to follow the softening of the resin. The result is to form gaps at the boundaries between the resin and the plunger and between the mold and the resin. The air in those gaps are introduced into the molten resin, and take the form of voids after the underfilling.

On the other hand, in the resin sealing method of the invention in which the resin tablet 80 is pressurized by the utilization of the urging force of the spring 61, if the resin tablet 80 is hard, the spring 61 is compressed to avoid the breakage of the resin tablet 80. When the resin tablet 80 is heated and rapidly softened, the urging force by the compressed spring 61 enables the cull insert 60 to satisfactorily follow the softening of the resin tablet.

Therefore, there is no chance that the pressure in the resin tablet and the pressure of the molten resin abruptly decrease. As a result, no gap is formed between the mold and the resin, and no air bubble encapsulation takes place. A reliable underfilling is secured not using high molding pressure.

In the method for feeding the molten resin under pressure by the utilization of the urging force of the spring, the resin is automatically fed by the utilization of the clamping forces of the mold. This method is advantageous in that the construction of the mold is simple, and realizes the resin sealing apparatus by use of a press machine of a small output when comparing with the transfer molding machine.

The above-mentioned embodiment uses the spring 61 for generating the urging force. If necessary, any other suitable spring, e.g., a compressed spring, may be used instead of the above one. Granular resin or other type of resin may be used in place of the resin tablet.

In the present embodiment, the cull insert 60 of the top half of the mold is driven to press the resin tablet 80. Alternatively, the center block 110 of the bottom half may be driven to press the resin tablet 80.

In the construction where the resin is fed under pressure by the cull insert 60, the molding surface of the top half 26 of the mold including the cull insert 60 is covered with the release film 20. The covering of the molding face with the release film effectively operates. Because of this, there is no danger that the resin enters the sliding portion of the cull insert 60; In other words, there is no need of accurately working the cull insert 60 so as to prevent the resin from entering thereinto. The cull insert 60 may be smoothly movable without any restriction of its motion.

When the resin tablet 80 is set to the mold while being laid down, the resin tablet 80 may be placed such that its longitudinal direction is parallel to or orthogonal to the direction in which the runner path extends.

In the resin sealing apparatus of the embodiment, to elastically clamp the molded piece 40, the cavity insert 62*b* for holding the semiconductor chip 12 is supported while being urged in the mold closing direction, and the bottom half block 28*a* for supporting the substrate 10 is supported while being urged in the mold closing direction. Thus, the cavity insert 62*b* and the bottom half block 28*a* are provided so as to be elastically pushed in the mold closing direction. Therefore, if the substrate 10 and the semiconductor chip 12 are not uniform in their thickness, this structure absorbs the thickness difference.

Figure 12:
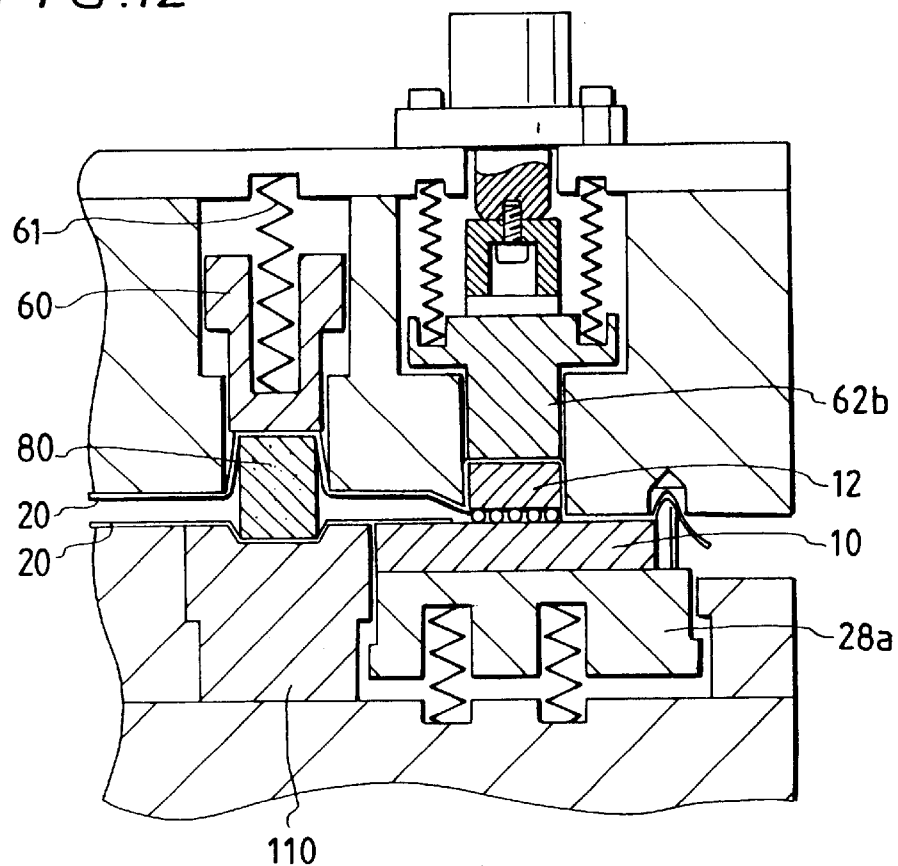
FIG. 12 is a cross sectional view showing yet another resin sealing apparatus.
Figure 13:
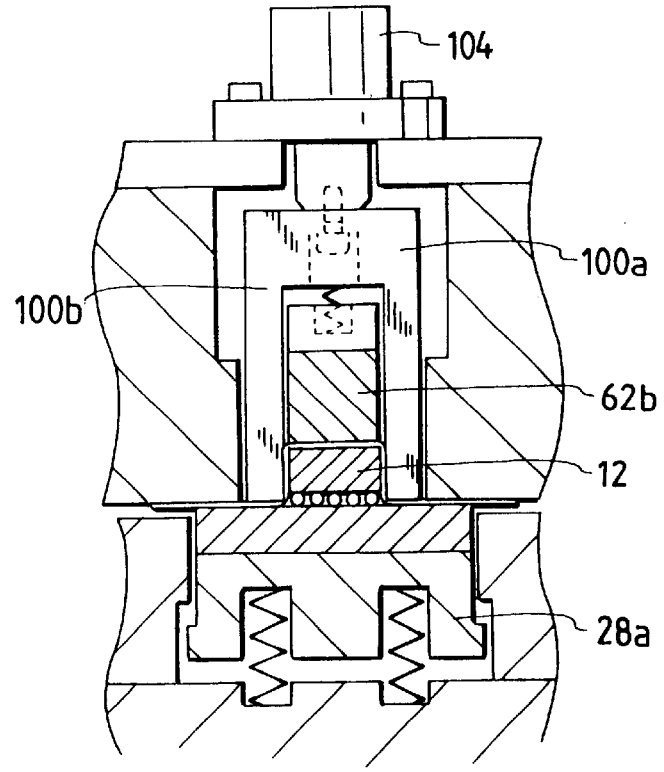
FIG. 13 is a cross sectional view showing the resin sealing by the side block.

FIG. 12 is a cross sectional view showing yet another resin sealing apparatus which includes the cull insert 60 urged by the spring 61 and the fixed center block 110.

The resin sealing apparatus is characterized in that the resin tablet 80 is placed while being laid down, the molded piece 40 is elastically clamped in the thickness direction, with the cavity insert 62*b* and the bottom half block 28*a*, and the side faces of the semiconductor chip 12 are held with the side blocks 100*a* and 10*b*. Numeral 104 is a cylinder for vertically driving the side blocks 100*a* and 100*b*.

The resin sealing apparatus holds the resin tablet 80 between the cull insert 60 and the center block 110, and fills the underfilled portion with the resin by the utilization of the urging force of the spring 61.

The resin sealing apparatus seals the molded piece 40 having the underfilled portion with the resin. The resin sealing method for feeding the resin under pressure by use of the center block 110 and the cull insert 60 urged in the mold closing direction, is applicable to the resin sealing of general molded pieces.

Figure 14:
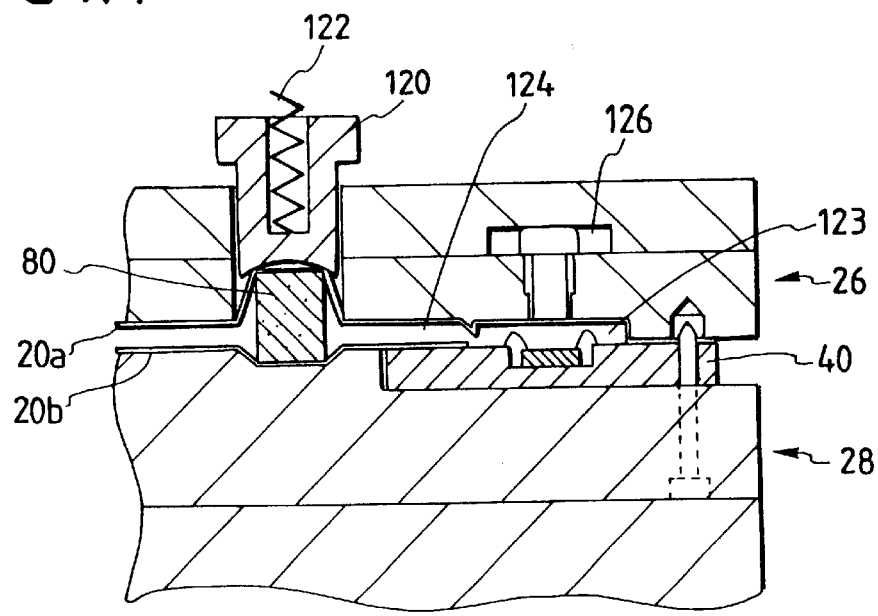
FIG. 14 is a cross sectional view showing a resin sealing apparatus.
Figure 15:
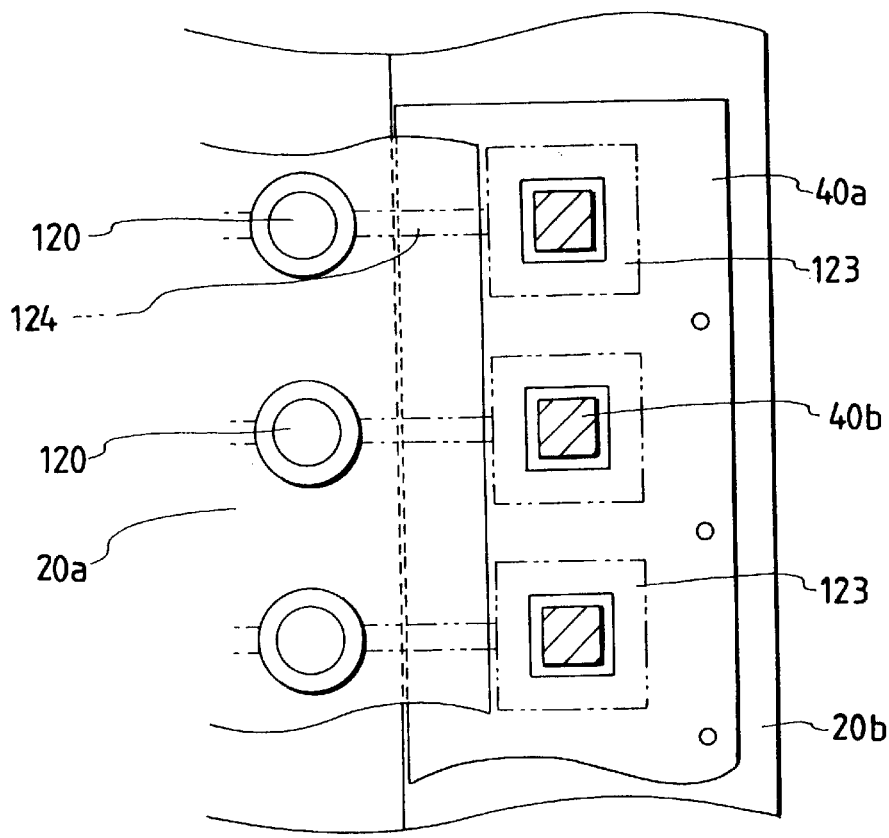
FIG. 15 is a plan view showing the resin sealing apparatus of FIG. 14.

FIGS. 14 and 15 show a resin sealing apparatus for sealing a molded piece 40 in which a substrate 40a and a semiconductor chip 40b are connected by wire bonding.

A recess to which a resin tablet 80 is set is formed in the central part of the bottom half 28, and a plunger 120 is provided in the top half 26 opposed to the bottom half. The plunger 120 corresponds to the cull insert in the above-mentioned embodiment. The plunger 120 is supported in a state that it is urged in the mold closing direction by a spring 122. A pressing face of the plunger 120, used for pressing the resin tablet 80, is curved inwardly and spherical in cross section.

As in the above-mentioned embodiment, a cavity 123 is located at the resin sealing position of the molded piece 40; a runner path 124 is provided which communicates a portion equipped with the plunger 120 with the cavity 123; and the parting face of the top half 26 is covered with the release film 20a. Numeral 126 is an air suction passage 126 for attracting the release film 20a to the inner surface of the cavity 123 by air absorption. A release film 20b covers a range from a position at which the resin tablet 80 is set to a region where the runner path 124 extends in the bottom half 28 of the mold.

FIG. 15 is a plan view showing a layout including the plungers 120, runner path 124, cavity 123, substrate 40a, semiconductor chip 40b and the like, and a layout of the release films 20a and 20b.

The resin sealing operation will be described. The mold is opened; the molded piece 40 is set to the bottom half 28 of the mold; the release films 20a and 20b are supplied to the top half 26 and the bottom half 28; the resin tablet 80 is supplied; and the mold is closed. The molded piece 40 is clamped with the top half 26 and the bottom half 28; the plunger 120 is lifted while resisting the urging force of the spring 122, with the resin tablet 80 inserted therebetween; the resin tablet 80 is molten and pressurized by the urging force of the spring 122; and the molten resin is fed to the cavity 123 by way of the runner path 124 and the gate.

The resin sealing method utilizing the urging force by the spring 122 is applicable to various types of molded pieces than the molded piece in which the semiconductor chip is mounted on the substrate.

In the above-mentioned embodiments, the semiconductor chip 12 is put on the top half of the mold; however, the resin sealing portion may be formed in the bottom half, if required.

The resin sealing method and the resin sealing apparatus, which are constructed according to the present invention, have the following useful effects. A resin material is clamped while resisting the urging force of an urging means when the mold is closed. Molten resin is fed under pressure by the utilization of the urging force of the urging means. Therefore, the resin filling is performed while air is not encapsuled in the resin, the resultant resin sealing is high in reliability. Further, there is no need of high molding pressure for the resin sealing, and the mold is simplified in structure.

The perimeter of the underfilled portion of a molded piece is closed by a release film, and the underfilled portion is filled with the resin by the transfer mold process. The joining portion between the semiconductor chip and the substrate is completely filled with the resin without any generation of voids. Since the transfer molding process is used, a reliable resin filling is ensured for the molded piece of which the underfilled portion is narrow and for the case where the filler-contained resin is used. This results in a uniform product quality, reliable resin sealing, and efficient sealing work.

What is claimed is:

1. A resin sealing method for sealing a molded piece including a semiconductor chip, said method comprising the steps of:
   providing a first transfer mold and a second transfer mold;
   providing a first release film on said first transfer mold;
   placing said molded piece in said second transfer mold;
   providing a second release film on said second transfer mold, but not between said molded piece and said second transfer mold;
   clamping said molded piece between said first and said second transfer molds; and
   feeding molten resin to said molded piece under pressure between said first and said second transfer molds, thereby filling said molded piece with resin material.

2. A resin sealing method according to claim 1, wherein said resin material is a cylindrical resin tablet.

3. A resin sealing method for sealing an underfilled portion of a molded piece in which a semiconductor chip is mounted on a substrate, said method comprising the steps of:
   providing a first transfer mold and a second transfer mold;
   providing a first release film on said first transfer mold;
   placing said molded piece in said second transfer mold;
   providing a second release film on said second transfer mold, but not between said molded piece and said second transfer mold;
   clamping said molded piece between said first and said transfer molds, such that said first and said second release films close a perimeter of said underfilled portion except a portion to which a gate continuous to said underfilled portion is connected; and
   feeding said sealing resin under pressure to said underfilled portion.

4. A resin sealing method according to claim 3, wherein when said underfilled portion is closed by said first and said second release films, one of said first and said second release films is pressed against a side face of said semiconductor chip, whereby only an interior of said underfilled portion is filled with said sealing resin.

5. A resin sealing method according to claim 4, wherein when said underfilled portion is closed by said first and said second release films, one of said first and said second release films is pressed against a side face of said semiconductor chip by an elastic member.

6. A resin sealing method according to claim 3, wherein when said underfilled portion is closed by said first and said second release films, said sealing resin fills out side-face sealing portions provided between side faces of said semiconductor chip and one of said first and said second release films, and said underfilled portion.

7. A resin sealing method according to claim 6, wherein when said underfilled portion is filled with said sealing resin, a side face of said semiconductor chip to which said gate is to be connected and a side face thereof opposed to and parallel to said gate-connecting side face are both closed by said first and said second release films.

8. A resin sealing method according to any of claims 3, 4, 5, 6 and 7, further comprising the step of:

applying a pulsative motion to said sealing resin.

9. A resin sealing method for sealing a joining portion between a semiconductor chip and a substrate by feeding a sealing resin under pressure to an underfilled portion of a molded piece including the substrate and the semiconductor chip on the substrate, said method comprising the steps of:

providing a mold having a portion in which the sealing resin is supported and movable in a mold opening/closing direction through an elastic material;

clamping the molded piece to close a peripheral portion of the underfilled portion with a release film except a portion to which a gate continuous to the underfilled portion is connected;

clamping the sealing resin by the mold against an urging force of the elastic material; and feeding the molten sealing resin under pressure to the underfilled portion of the molded piece by a pressure force of the elastic material through the mold and the release film, to seal the joining portion.

* * * * *